(12) United States Patent
Chu et al.

(10) Patent No.: US 7,977,743 B2
(45) Date of Patent: Jul. 12, 2011

(54) ALTERNATING-DOPING PROFILE FOR SOURCE/DRAIN OF A FET

(75) Inventors: Chen-Liang Chu, Hsin-Chu (TW);
Chun-Ting Liao, Hsin-Chu (TW);
Fei-Yuh Chen, Hsinchu (TW);
Tsung-Yi Huang, Hsin-Chu (TW)

(73) Assignee: Taiwan Semiconductor Manufacturing Company, Ltd., Hsin-Hu (TW)

( * ) Notice: Subject to any disclaimer, the term of this patent is extended or adjusted under 35 U.S.C. 154(b) by 0 days.

(21) Appl. No.: 12/392,343

(22) Filed: Feb. 25, 2009

(65) Prior Publication Data
US 2010/0213542 A1    Aug. 26, 2010

(51) Int. Cl.
*H01L 29/06* (2006.01)
(52) U.S. Cl. .................................. 257/336; 257/E29.012
(58) Field of Classification Search .............. 257/E29.12
See application file for complete search history.

(56) References Cited

U.S. PATENT DOCUMENTS

| | | | | |
|---|---|---|---|---|
| 5,635,413 A | * | 6/1997 | Mitsunaga et al. | 438/298 |
| 6,110,837 A | | 8/2000 | Linliu et al. | |
| 6,297,108 B1 | | 10/2001 | Chu | |
| 6,448,625 B1 | * | 9/2002 | Hossain et al. | 257/493 |
| 6,770,529 B2 | * | 8/2004 | Lee et al. | 438/247 |
| 6,872,647 B1 | | 3/2005 | Yu et al. | |
| 6,878,596 B2 | | 4/2005 | Park et al. | |
| 7,023,050 B2 | * | 4/2006 | Salama et al. | 257/341 |
| 7,368,357 B2 | | 5/2008 | Lee | |
| 2005/0040493 A1 | * | 2/2005 | Yeo et al. | 257/536 |
| 2005/0184335 A1 | * | 8/2005 | Gi Lee | 257/327 |
| 2006/0125023 A1 | * | 6/2006 | Shigyo et al. | 257/384 |
| 2008/0054309 A1 | * | 3/2008 | Fang et al. | 257/213 |
| 2008/0237703 A1 | | 10/2008 | Lin et al. | |

* cited by examiner

*Primary Examiner* — Benjamin P Sandvik
(74) *Attorney, Agent, or Firm* — Haynes and Boone, LLP

(57) ABSTRACT

A semiconductor device is provided. In an embodiment, the device includes a substrate and a transistor formed on the substrate. The transistor may include a gate structure, a source region, and a drain region. The drain region includes an alternating-doping profile region. The alternating-doping profile region may include alternating regions of high and low concentrations of a dopant. In an embodiment, the transistor is a high voltage transistor.

14 Claims, 4 Drawing Sheets

US 7,977,743 B2

ALTERNATING-DOPING PROFILE FOR SOURCE/DRAIN OF A FET

BACKGROUND

The present disclosure relates generally an integrated circuit device and, more particularly, a transistor having an alternating-doping profile for a device feature of the transistor.

High-voltage transistors (HVMOS transistors) often include double-diffused drains (DDD) as a device feature (e.g., source/drain) of the transistor. The DDD may, for example, prevent electrostatic discharge (ESD) and/or reduce hot electron carrier effects.

However, conventional DDD may be disadvantageous in that they require a high dosage of impurities (e.g., dopants). These can in turn induce DDD MOS gate induced drain leakage (GIDL) which may be of particular concern as gate lengths shorten. GIDL current is generated in the drain region of the transistor that overlaps with the gate electrode. GIDL current is generated because of the high electric field which is induced between the gate electrode (which may be at ground) and the drain (which a high voltage may be applied to). A greater GIDL is disadvantageous in that it will lower the threshold voltage of the device.

Therefore, what is needed is an improved structure for a FET device.

SUMMARY

In one embodiment, a semiconductor device is provided. The device includes a substrate and a transistor device formed on the substrate. The transistor (e.g., field effect transistor (FET)) includes a gate structure, a source region, and a drain region. The drain region includes an alternating-doping profile region. An alternating-doping profile region may include a plurality of areas that alternate between a higher dopant concentration (e.g., N+ region) and a lower dopant concentration (e.g., N− region). In an embodiment, the drain region includes a diffused drain in which the alternating-doping profile region is disposed. The diffused drain may include a lower dopant concentration than the higher dopant concentration of the alternating-doping profile region. In an embodiment, the transistor is a high-voltage FET.

In another embodiment, a semiconductor device is provided. The device includes a high voltage well in the semiconductor substrate. The high voltage well is formed in the substrate and includes a dopant of a first type. A first source/drain region is disposed in the high voltage well. The source region includes a dopant of a second type. A second source/drain region is disposed in the high voltage well. The second source/drain region is spaced a distance from the first source/drain region. The second source/drain region includes: a first region having a dopant of the second type; and a second region disposed in the first region. The second region includes a dopant of the second type. The second region includes a first and second concentration of a dopant of the second type. In an embodiment, the dopant of the first type is p-type and the dopant of the second type is n-type. In an embodiment, the second region of the second source/drain includes regions of N+ and N− concentrations.

In an embodiment, a method of forming a semiconductor device is also provided. The method includes providing a semiconductor substrate and forming a gate structure on the semiconductor substrate. One of a source and a drain are formed adjacent the gate structure. The forming the at least one of a source and a drain includes: doping the substrate to form an area of a first concentration of a first dopant type to form a first doped region; and doping a portion of the first doped region to provide a second doped region and a third doped region having a second concentration of the first dopant type. The third doped region is spaced a distance from the second doped region.

DETAILED DESCRIPTION

Figure 1:
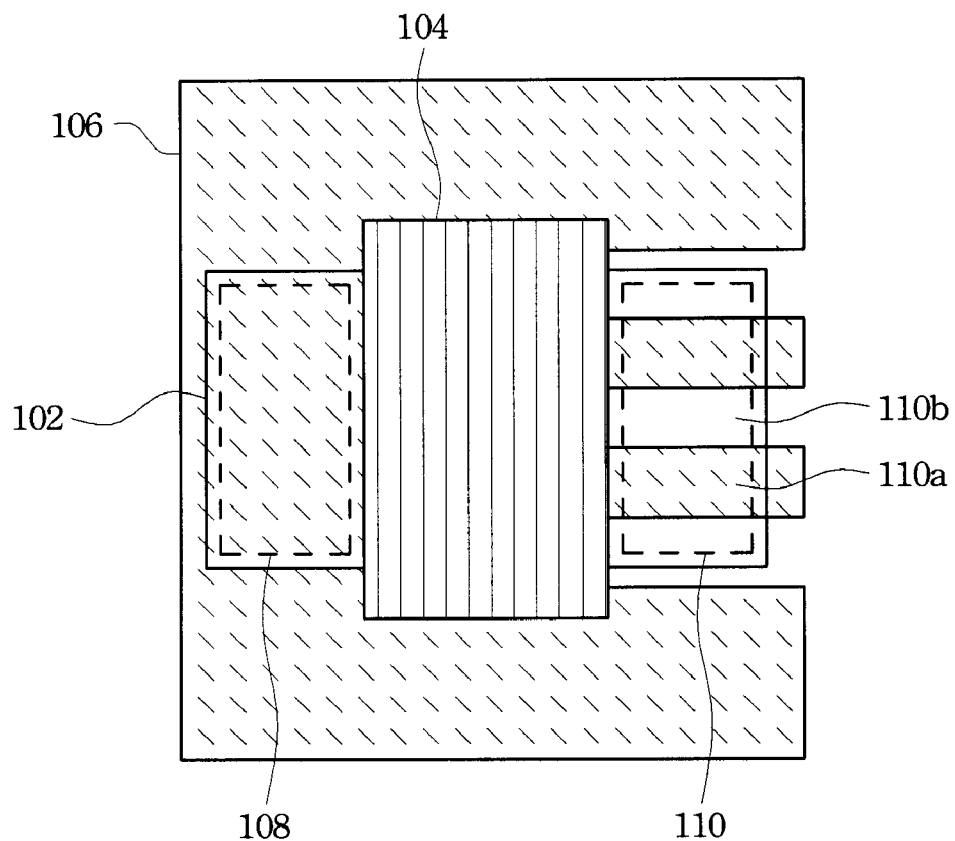
FIG. 1 is a top view of an embodiment of a plurality of patterns used to form a transistor device.

The present disclosure relates generally to forming an integrated circuit device on a substrate and, more particularly, to fabricating a semiconductor device (e.g., FET device) which including a feature having an alternating-doping profile. This may be used to form HVMOS FETs and/or other semiconductor devices. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. The present disclosure is directed to high voltage FET devices (PFET, NFET, MOSFET), however, any device may benefit from the disclosure and an alternating doping profile device feature. Further still, one of ordinary skill in the art would recognize that the disclosure of dopant types of a structure includes embodiments reversing the dopant types.

Referring to FIG. 1, provided is a top view illustrating a plurality of patterns used to form a device (e.g., transistor) or portion thereof. Each pattern may be provided by a photomask (e.g., alternating phase shift mask (alt-PSM), attenuating phase shift mask (att-PSM), chromeless (CPL), binary, and/or other mask types). The photomask may be a transparent substrate such as fused silica ($SiO_2$) or quartz, calcium fluoride, and/or other suitable material. The patterns provided by the photomask may be formed by attenuating material such as chrome or other materials such as, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, and/or a combination thereof.

An active area (OD) pattern 102 defines the active region of a device. Outside of an area defined by the OD pattern 102, one or more isolation features may be formed. The isolation features may include shallow trench isolation (STI) structures or other suitable isolation feature such as a local oxidation of silicon (LOCOS) structure, field oxide (FOX) or a deep trench isolation structures. The isolation structure may include insulator material such as an oxide. The active area defined in the substrate may include suitable doping (e.g., p-type or n-type dopants) depending on the device to be formed in the region. The OD pattern 102 defines an area in which a device (e.g., FET) may be formed including the source, drain, and gate of the device.

A gate structure pattern 104 defines a gate structure on the active area. The gate structure may include a gate dielectric and a gate electrode and/or other suitable layers.

The source/drain pattern 106 includes a pattern that defines the source and drain or portions thereof associated with the gate structure pattern 104. The source/drain pattern 106 defines an area where dopants are introduced (e.g., n-type or p-type doping). In an embodiment, the s/d pattern 106 defines an area of N+ (or P+) doping. Example n-type dopants include arsenic, phosphorus, antimony, and/or other suitable dopants. Example p-type dopants include boron, $BF_2$, aluminum, and/or other suitable dopants. Again, it should be noted throughout the disclosure that an embodiment illustrating a type of doping (e.g., n-type) is also applicable to use of an opposite type of doping (e.g., p-type).

The source/drain pattern 106 and OD pattern 102 define a rectangular-shaped device feature (source/drain) region 108 (designated here as source 108). The OD pattern 102 and the source/drain pattern 106 also define an alternating-doping profile in a source/drain region 110 (designated here as alternating-doping profile drain 110). The alternating-doping profile drain region 110 provides areas within the drain 110 of doping, interposed and alternating with protected (masked) areas where a dopant is not provided. For example, pattern 110a defines an area for doping (e.g., an N+ doping) while pattern 110b defines an area protected from the doping. In an embodiment, the pattern 106 defines a region for N+ doping (e.g., the cross-hatched portion defines a region for an N+ doping).

Figure 2:
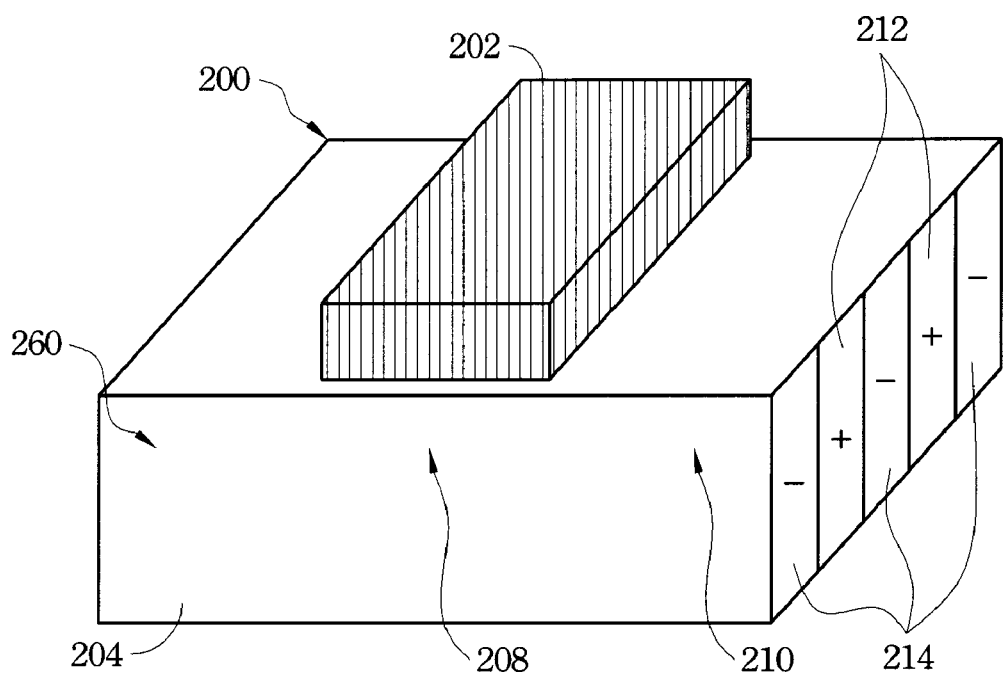
FIG. 2 is a perspective view of an embodiment of a semiconductor device including an alternating-doping profile device feature.

Referring now to FIG. 2, illustrated is a perspective view of a device 200. The device 200 may be formed using the patterns described above with reference to FIG. 1. The device 200 includes a gate structure 202. The gate structure 202 may be formed using a pattern such as the gate pattern 104, described above with reference to FIG. 1. The gate structure 202 may include a gate dielectric layer, a gate electrode and/or other suitable layers such as, interface layers, capping layers, contact structure, and the like. The gate dielectric may include silicon oxide, high dielectric-constant (high-k) materials, silicon oxynitride, combinations thereof, and/or other suitable materials. Examples of high-k materials include hafnium silicate, hafnium oxide, zirconium oxide, aluminum oxide, hafnium dioxide-alumina ($HfO_2$—$Al_2O_3$) alloy, combinations thereof, and/or other suitable compositions. The gate dielectric may be formed using chemical vapor deposition (CVD), physical vapor deposition (PVD), atomic layer deposition (ALD), thermal oxidation, combinations thereof, and/or other suitable processes. In an embodiment, the gate electrode includes polysilicon. In other embodiments, the gate structure may be a metal gate with the gate electrode including a metal composition. Examples of suitable metals for forming the gate electrode include Cu, W, Ti, Ta, TiN, TaN, NiSi, CoSi, and/or combinations thereof. The gate electrode layer may be formed by conventional methods known in the art such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art followed by a photolithography and etching processes.

The gate structure 202 is disposed on a substrate 204. In an embodiment, the substrate 204 is silicon in a crystalline structure. In alternative embodiments, the substrate 204 may include other elementary semiconductors such as germanium, or includes a compound semiconductor such as, silicon carbide, gallium arsenide, indium arsenide, and indium phosphide. The substrate 204 may include a silicon on insulator (SOI) substrate. The substrate 204 may be doped with impurities (n-type and/or p-type dopants) to provide the relevant functionality. In an embodiment, the substrate 204 includes a well such as a high-voltage well over which the gate 202 is formed, for example, in an embodiment where the device 200 is a high-voltage MOS transistor. In FIG. 2, the illustrated portion of the substrate 204 may be an active area. For example, the illustrated area of the substrate 202 may be defined by a pattern such as the OD pattern 102, described above with reference to FIG. 1.

The substrate 204 also includes a source region 206, a channel region 208, and a drain region 210. The source region 206, the channel region 208 and the drain region 210 may be doped to provide functionality to the device 200. For example, in an embodiment, the device 200 is a PMOS transistor and the source and drain regions 206, 210 are regions doped with a p-type dopant. In an embodiment, the device 200 is an NMOS transistor and the source and drain regions 206, 210 are regions doped with an n-type dopant. The dopants may be provided using processes known in the art such as, ion implantation, diffusion, thermal processing, and/or other suitable processes.

The source region 206 may include a rectangular-shaped source region. The rectangular-shaped region may include a substantially constant doping concentration. In an embodiment, the source region 206 includes a N+ (or alternatively P+) doping. In an alternative embodiment, the source region 206 may include an alternating-doping profile region such as described with reference to the drain region 210.

The drain region 210 includes an alternating-doping profile region. The alternating doping profile region includes alternating regions of higher dopant concentration and lower dopant concentration. The regions 212 of the drain region 210 provide a higher doping concentration (designated "+") and regions 214 of the drain region 210 provide a lower doping concentration (designated "−"). The regions 212 and regions 214 may include the same dopant type (e.g., be p-type or n-type regions). The regions 212 (e.g., N+ (or P+) regions) may include a concentration of approximately 1E14 to 1E16 atoms/cm$^2$. The regions 214 (e.g., N− (or P−) regions) may include a concentration of approximately 1E13 to 1E15 atoms/cm$^2$.

The drain region 210 including the alternating doping profile defined by regions 212 and 214 may be formed using a pattern such as the pattern 106, described above with reference to FIG. 1. For example, the pattern 110a may define the regions 212 and/or the pattern 110b define the regions 214. In an embodiment, the drain region 210 further includes a diffused drain (DD) region. The diffused drain region may include the same dopant type as the alternating-doping profile drain region 210. In an embodiment, the diffused drain region may include a concentration of dopant substantially similar to or less than the concentration of the region 214. The diffused drain region may be substantially similar to the diffused drain region 410, described with reference to FIG. 4.

In an embodiment, the alternating-doping drain region 210 includes n-type dopants. The region 212 may include N+ doping and the region 214 may include N− doping concentration. In an embodiment, a diffused drain includes an N− doped concentration (e.g., NDD). The source region 206 may include N+ doping. The substrate 204 may include a high-voltage well within which the source and drain regions 206 and 210 are formed. In an embodiment, the source and drain regions 206 and 210 include n-type dopants and the high-voltage well includes p-type dopants, however, other embodiments are possible.

Figure 3:
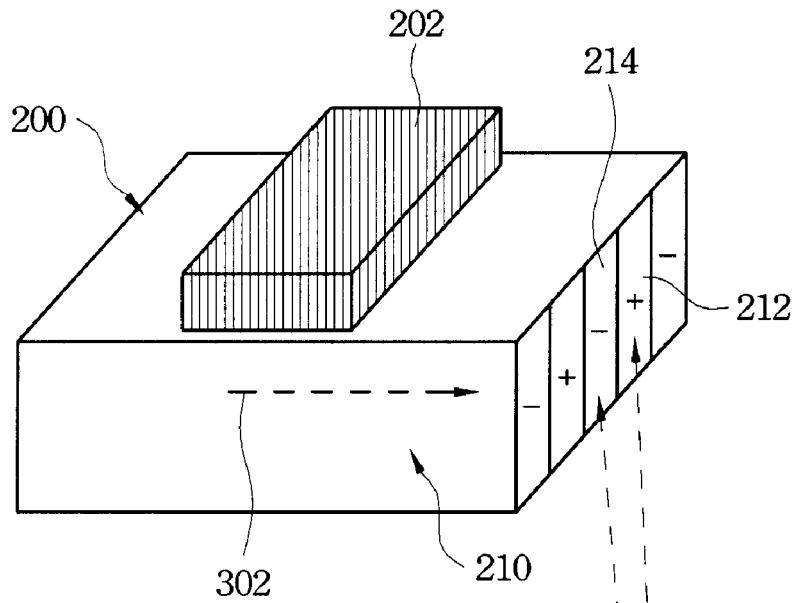
FIG. 3 is a cross sectional view of an embodiment of a semiconductor device and a corresponding graph illustrating an associated doping profile.
Figure 3:
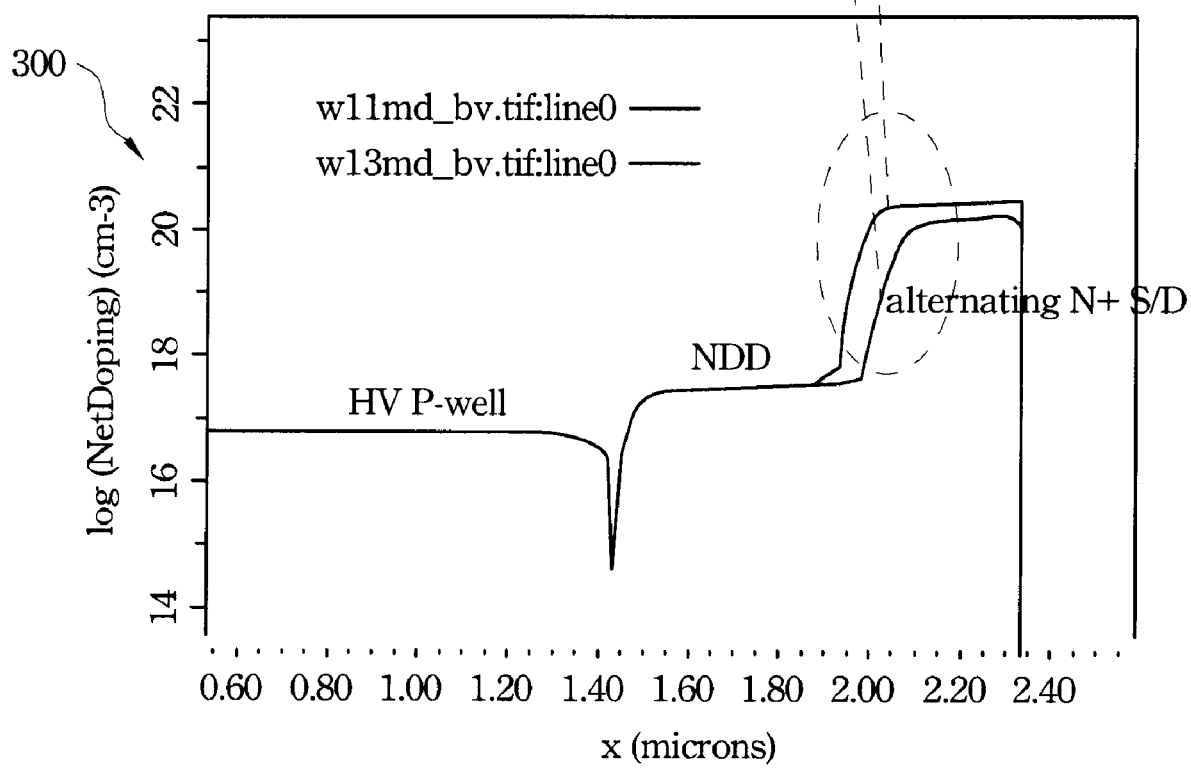

Referring to FIG. 3, a doping profile 300 associated with the device 200 is illustrated. The doping profile 300 corresponds to a lateral doping concentration of a device such as the device 200. The lateral reference line providing the doping profile is illustrated as reference line 302. The doping profile 300 includes an x-axis having a lateral distance of a device (e.g., along reference line 302) and a y-axis indicating doping concentration. The doping profile 300 includes a high-voltage (HV) P-well, a n-doped (diffused) drain (NDD), and an n-doped alternating-doping profile region (alternating N+ s/d). The doping profile 300 may also be associated with a device such as a device 400 illustrated in FIG. 4. The doping profile 300 illustrates in the alternating-doping profile region 210 of the device 200, a first doping concentration associated with the N− region 214 and a second doping concentration associated with the N+ region 212. Though illustrated as providing an n-channel device, numerous other embodiments are possible.

Figure 4:
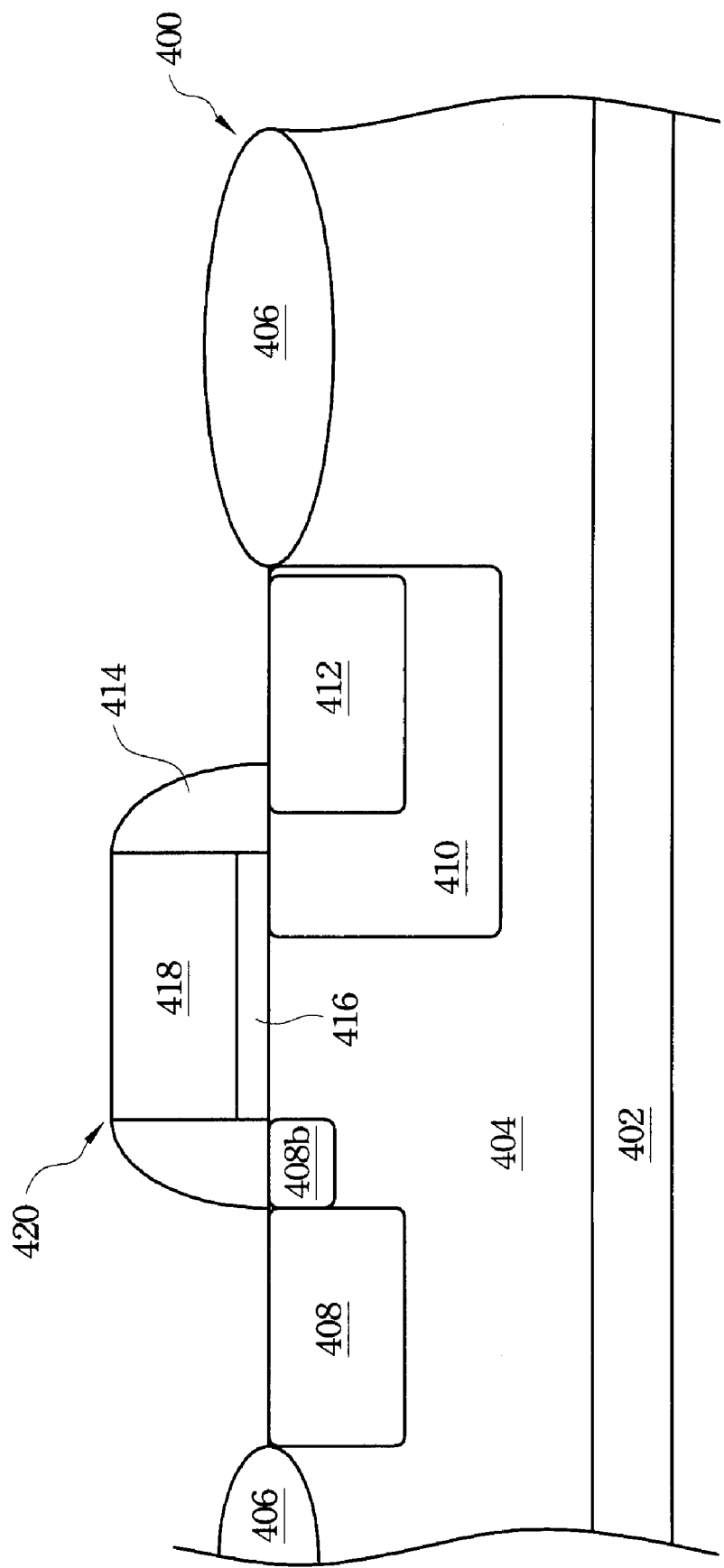
FIG. 4 is a cross sectional view of an embodiment of a semiconductor device including an alternating-doping profile device feature.

Referring to FIG. 4, illustrated is a semiconductor device 400. The device 400 may include an NMOS and/or PMOS transistor (NFET, PFET). In an embodiment, the device 400 includes a high voltage MOS transistor. The device 400 includes a substrate 402. The substrate 402 may be substantially similar to the substrate 204 described above with reference to FIG. 2. The substrate 402 may be a p-type or n-type substrate. A high-voltage (HV) well 404 is formed on the substrate 204. The HV well 404 may include n-type or p-type dopants. In an embodiment, the HV well 404 includes an opposite dopant type compared to the substrate 402. The HV well 404 may be formed using processes such as, ion implantation, diffusion, photolithography, and/or other suitable processes known in the art. The HV well 404 may include a doping concentration of dopants of about 1E12 atoms/cm$^2$ to about 1E13 atoms/cm$^2$, though numerous other embodiments are possible.

Isolation structures 406 are disposed on the substrate 402. The isolation structures 406 may include an insulating material (e.g., an oxide) and isolate one or more devices formed on the substrate 402 from each other. In an embodiment, the isolation structures 406 are LOCOS structures, however numerous other methods of isolation are possible.

A source region 408 is disposed in the substrate 402. The source region 408 may include n-type or p-type dopants. The source region 408 may be include the opposite dopant type from the HV well 404. The source region 408 includes a low-dose region 408b (LDD). The source region 408 may be N+ doped.

A diffused drain region 410 (DD 410) is formed on the substrate 402 in the HV well 404. The DD region 410 includes n-type or p-type dopants. The DD region 410 may include the opposite dopant type from the HV well 404 in which it is disposed. In an embodiment, the DD region 410 is N− doped.

An alternating-doping profile drain region 412 is disposed in the drain region 410. The alternating-doping profile drain region 412 may include the same dopant type as the DD region 410. The alternating-doping profile drain region 412 may be substantially similar to the drain region 210, described above with reference to FIGS. 2 and 3. For example, the alternating-doping profile drain region 412 includes regions of alternating high and low concentration of dopants (e.g., alternating N+ and N− regions). The alternating regions extend parallel to the channel associated with the gate structure 420 (e.g., parallel to the plane of the cross-section of FIG. 4).

The drain regions 410 and 412 may function as a double diffused drain (DDD) but provide a lower concentration of dopants in the region 412 as it includes low concentration regions of dopants interposing the high concentrations of dopants (which may be found in a conventional DDD). In an embodiment, the source region 408 may include regions substantially similar to the regions 410 and 412.

The source and drain regions 408, 410 and 412 are associated with a gate structure 420. The gate structure 420 includes a gate dielectric 416, a gate electrode 418, and a plurality of spacer elements 414. The gate structure 420 may be substantially similar to the gate structure 202, described above with reference to FIG. 2. The gate dielectric 416 may include silicon oxide, high dielectric-constant (high-k) materials, silicon oxynitride, combinations thereof, and/or other suitable materials. Examples of high-k materials include hafnium silicate, hafnium oxide, zirconium oxide, aluminum oxide, hafnium dioxide-alumina (HfO$_2$—Al$_2$O$_3$) alloy, or combinations thereof. The gate dielectric 416 may be formed using chemical vapor deposition (CVD), physical vapor deposition (PVD), atomic layer deposition (ALD), thermal oxidation, combinations thereof, and/or other suitable processes. In an embodiment, the gate electrode 418 includes polysilicon. In other embodiments, the gate structure 420 may be a metal gate with the gate electrode 418 including a metal composition. Examples of suitable metals for forming the gate electrode include Cu, W, Ti, Ta, TiN, TaN, NiSi, CoSi, and/or combinations thereof. The gate electrode 418 may be formed by conventional methods known in the art such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art followed by a photolithography and etching processes. The spacer elements 414 may comprise silicon nitride, silicon oxide, silicon carbide, silicon oxynitride, combinations thereof, and/or other suitable materials. The spacer elements 414 may have multilayer structure (e.g., include liner layers) and may be formed by depositing dielectric material and then etching back to form the spacer profile. The spacer elements 414 may define an area for a low-dose drain such as, region 408b.

In an embodiment, the device 400 is a high voltage NFET device and includes the drain region 410 having an N− dopant concentration and the alternating-doping profile drain region 412 having and alternating n− and n+ dopant concentration. In the embodiment, the high voltage well 404 may be a p-type well. The source region 408 may be an N+ dopant concentration.

In an embodiment, the device 400 is a high voltage PFET device and includes the drain region 410 has a P− dopant concentration and the alternating-doping profile drain region 412 has an alternating P− and P+ dopant concentration. In the embodiment, the high voltage well 404 may be an n-type well. The source region 408 may be a P+ dopant concentration.

Figure 5:
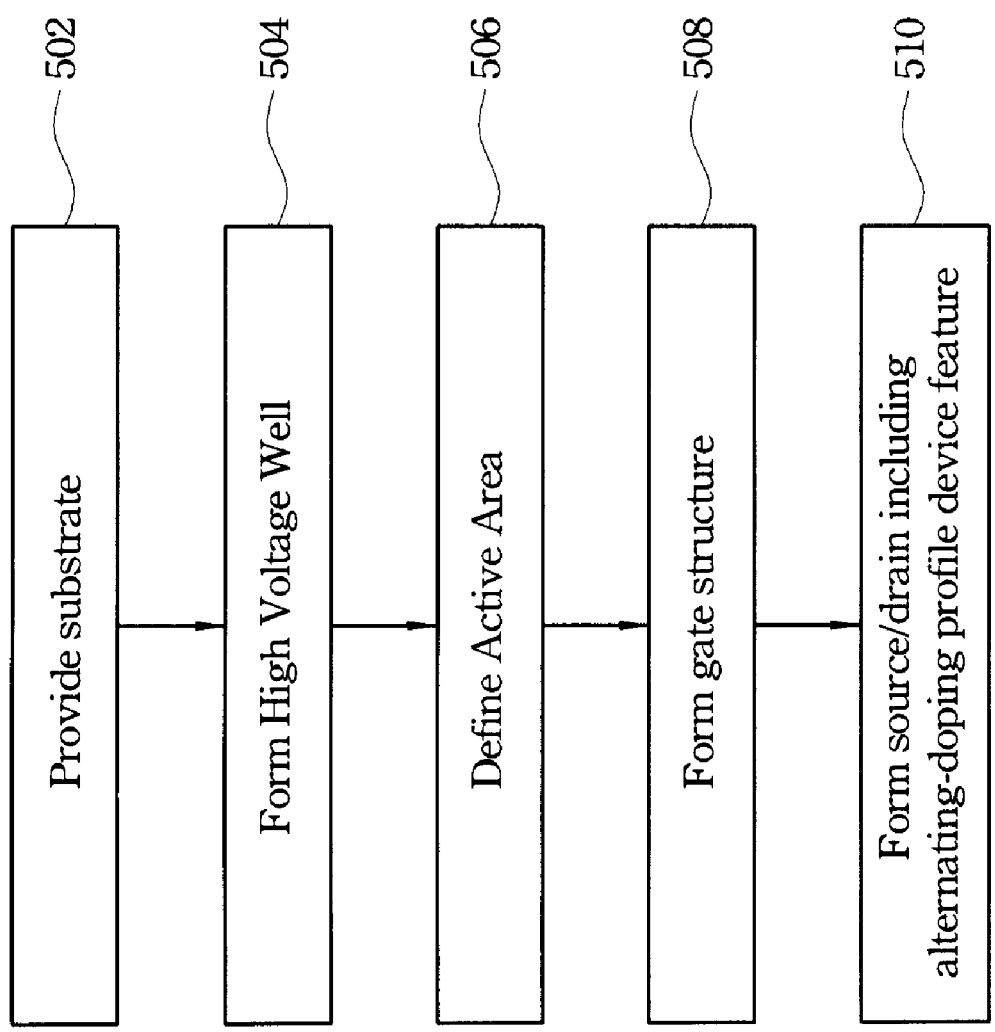
FIG. 5 is a flow chart illustrating an embodiment of a method of forming a semiconductor device including an alternating-doping profile device feature.

Referring to FIG. 5, illustrated is a method 500 for forming a device including an alternating-doping profile region. The method 500 may be used in fabricating the device 200 and/or the device 400 or portion thereof. The method 500 begins at step 502 where a substrate is provided. The substrate may be substantially similar to the substrate 402 described above with reference to FIG. 4. The method 500 then proceeds to step 504 where a high voltage well is provided. The high voltage well may be formed by introducing p-type or n-type dopants into the substrate 402. The high voltage well may be formed using ion implantation, diffusion, and/or other suitable processes known in the art. In an embodiment, the high voltage well may be substantially similar to the high voltage well 404, described above with reference to FIG. 4.

The method 500 then proceeds to step 506 where an active area is defined. The active area may be defined using a pattern such as the pattern 102, described above with reference to FIG. 1. The active area provides an area where a device will be formed. One or more isolation features may be formed interposing one or more active areas.

The method 500 then proceeds to step 508 where a gate structure is formed. The gate structure may be substantially similar to the gate structure 420 described above with reference to FIG. 4.

The method 500 then proceeds to step 510 where source/drain regions are formed on the substrate adjacent the gate structure. One or more of the source/drain regions may include an alternating-doping profile region (e.g., a region of alternating high and low concentrations of a particular dopant type). The source/drain regions may be substantially similar to the source and drain regions 408, 410, and/or 412 described above with reference to FIG. 4 and/or be substantially similar to the source/drain regions 206 or 210 of the device 200, described above with reference to FIG. 2. Step 510 may include using a mask including a pattern such as the pattern 106 described above with reference to FIG. 1.

The method 500 is exemplary only and not intended to be limiting. One or more steps of the method 500 may be omitted. Any number of steps may be included that are not described in detail above. In addition, the order of the steps described is exemplary only and in alternative embodiments the steps may be performed in varying sequence.

Therefore, provided is a device and method of fabrication thereof, including an alternating-doping profile device feature (e.g., source or drain). The alternating-doping profile device feature may be included in a high voltage device and may reduce the GIDL current as the effective dose of impurities (n-type or p-type dopants) in the device feature is reduced.

What is claimed is:

1. A semiconductor device, comprising:
    a substrate;
    a transistor device formed on the substrate, wherein the transistor device includes:
        a gate structure,
        a source region, and
        a drain region, wherein the drain region comprises an alternating-doping profile region including a first region and a second region having a dopant with a first concentration and a third region having the dopant with a second concentration and interposing the first and second region, wherein the second concentration is lower than the first concentration; and
    a channel region underlying the gate structure, wherein each of the first, second and third regions directly interface to the channel region.

2. The semiconductor device of claim 1, wherein the drain region comprises a diffused drain region underlying the alternating-doping profile region.

3. The semiconductor device of claim 1, wherein the source region comprises an alternating-doping profile region including a fourth region and a fifth region having a third concentration of the dopant and a sixth region having a fourth concentration of the dopant and interposing the fourth and fifth region, wherein the third and fourth concentration are different.

4. The semiconductor device of claim 1, further comprising:
    a high voltage well disposed in the substrate and underlying the transistor device.

5. The semiconductor device of claim 1, wherein the gate structure comprises a high dielectric constant (high-k) gate dielectric.

6. The semiconductor device of claim 1, wherein the alternating-doping profile region comprises a plurality of N+ doped regions and N− doped regions, wherein the plurality of N+ doped regions are interposed by N− doped regions.

7. The semiconductor device of claim 1, wherein the transistor is a high voltage field effect transistor.

8. A semiconductor device, comprising:
    a high voltage well disposed in a semiconductor substrate, wherein the high voltage well has a dopant of a first type;
    a first source/drain region disposed in the high voltage well, wherein the first source/drain region has a dopant of a second type;
    a second source/drain region disposed in the high voltage well, wherein the second source/drain region is spaced a distance from the first source/drain region, and wherein the second source/drain region comprises:
        a first region having a dopant of the second type; and
        a second region disposed in the first region, wherein the second region has a dopant of the second type, and wherein the second region comprises portions having a first concentration and portions having a second concentration of the dopant of the second type; and
    a channel region disposed between the first source/drain and the second source/drain, wherein each of the portion having the first concentration and the portion having the second concentration of the second region directly interface with the channel region.

9. The semiconductor device of claim 8, wherein the second type of dopant is n-type.

10. The semiconductor device of claim 8, wherein the first region includes a dopant concentration less than the second concentration.

11. The semiconductor device of claim 8, further comprising:
    a gate structure on the substrate between the first and the second source/drain regions.

12. The semiconductor device of claim 11, wherein the gate structure comprises polysilicon.

13. The semiconductor device of claim 8, wherein the first source/drain region includes the dopant of the second type in the second concentration.

14. The semiconductor device of claim 8, wherein the second region disposed in the first region comprises alternating regions of the first and second concentration of the dopant of the second type, wherein each of the alternating regions interfaces with the channel region.

* * * * *